United States Patent
Jeong et al.

(10) Patent No.: US 10,446,478 B2
(45) Date of Patent: Oct. 15, 2019

(54) SEMICONDUCTOR PACKAGE (71) Applicant: SAMSUNG ELECTRONICS CO., LTD., Suwon-si (KR)

(72) Inventors: Kwang Ok Jeong, Suwon-Si (KR); Dong Won Kang, Suwon-Si (KR); Young Gwan Ko, Suwon-Si (KR); Ik Jun Choi, Suwon-Si (KR); Jung Soo Byun, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/976,387

(22) Filed: May 10, 2018

(65) Prior Publication Data
US 2019/0131225 A1  May 2, 2019

(30) Foreign Application Priority Data
Nov. 1, 2017  (KR) .................. 10-2017-0144918

(51) Int. Cl.
*H01L 23/498* (2006.01)
*H01L 21/48* (2006.01)
(Continued)

(52) U.S. Cl.
CPC .... *H01L 23/49822* (2013.01); *H01L 21/4853* (2013.01); *H01L 21/4857* (2013.01);
(Continued)

(58) Field of Classification Search
CPC ............... H01L 23/498; H01L 23/5383; H01L 23/49822; H01L 23/5389; H01L 23/538;
(Continued)

(56) References Cited

U.S. PATENT DOCUMENTS

2006/0060970 A1   3/2006  Jeong et al.
2008/0047137 A1*  2/2008  Asahi ................. H01R 13/2414
                                                                  29/876
(Continued)

FOREIGN PATENT DOCUMENTS

JP   2012-134396 A   7/2012
JP   2014-160705 A   9/2014
(Continued)

OTHER PUBLICATIONS

Taiwanese Office Action dated Dec. 11, 2018 issued in Taiwanese Patent Application No. 107116316 (with English translation).
(Continued)

*Primary Examiner* — Chuong A Luu
(74) *Attorney, Agent, or Firm* — Sughrue Mion, PLLC (57) ABSTRACT

A semiconductor package includes: a semiconductor chip having an active surface having connection pads disposed thereon; a connection member disposed on the active surface of the semiconductor chip and including a redistribution layer electrically connected to the connection pads; a passivation layer disposed on the connection member; and an underbump metallurgy (UBM) layer embedded in the passivation layer and electrically connected to the redistribution layer of the connection member, wherein the UBM layer includes a UBM pad embedded in the passivation layer, at least one plating layer disposed on the UBM pad and having side surfaces of which at least portions are covered by the UBM pad, and a UBM via penetrating through at least portions of the passivation layer and electrically connecting the redistribution layer of the connection member and the UBM pad to each other.

20 Claims, 10 Drawing Sheets (51) Int. Cl.
*H01L 25/18* (2006.01)
*H01L 23/538* (2006.01)
*H01L 25/00* (2006.01)
*H01L 23/00* (2006.01)

(52) U.S. Cl.
CPC .......... *H01L 23/5383* (2013.01); *H01L 25/18* (2013.01); *H01L 25/50* (2013.01); *H01L 23/49894* (2013.01); *H01L 24/16* (2013.01); *H01L 24/73* (2013.01); *H01L 2224/16227* (2013.01); *H01L 2224/73204* (2013.01)

(58) Field of Classification Search
CPC ... H01L 2224/0401; H01L 2224/03914; H01L 2224/11914; H01L 2224/11526
USPC .......................................................... 257/737
See application file for complete search history.

(56) References Cited

U.S. PATENT DOCUMENTS

| | | |
|---|---|---|
| 2009/0095508 A1 | 4/2009 | Park et al. |
| 2009/0140442 A1 | 6/2009 | Lin |
| 2011/0254156 A1 | 10/2011 | Lin |
| 2012/0012997 A1 | 1/2012 | Shen et al. |
| 2012/0161311 A1 | 6/2012 | Miyasaka et al. |
| 2015/0125993 A1 | 5/2015 | Lee et al. |
| 2015/0171039 A1 | 6/2015 | Cheng et al. |
| 2016/0276173 A1* | 9/2016 | Song ................. H01L 23/49816 |
| 2016/0372395 A1 | 12/2016 | Shih et al. |
| 2018/0151500 A1* | 5/2018 | Chen ................... H01L 23/5383 |

FOREIGN PATENT DOCUMENTS

| | | |
|---|---|---|
| KR | 10-0605315 B1 | 7/2006 |
| KR | 10-2009-0038552 A | 4/2009 |
| KR | 10-2009-0057888 A | 6/2009 |
| KR | 10-2011-0103680 A | 9/2011 |
| KR | 2012-134396 A | 7/2012 |
| KR | 10-2015-0051358 A | 5/2015 |
| KR | 10-2015-0069492 A | 6/2015 |
| KR | 10-1574019 B1 | 12/2015 |
| TW | 201203483 A1 | 1/2012 |
| TW | 201701443 A | 1/2017 |

OTHER PUBLICATIONS

Korean Office Action dated Jan. 22, 2019 issued in Taiwanese Patent Application No. 10-2017-0144918 (with English translation).
Office Action issued in corresponding Korean Application No. 10-2017-0144918, dated Mar. 6, 2019.

* cited by examiner

SEMICONDUCTOR PACKAGE

CROSS-REFERENCE TO RELATED APPLICATION(S)

This application claims the benefit of priority to Korean Patent Application No. 10-2017-0144918 filed on Nov. 1, 2017 in the Korean Intellectual Property Office, the disclosure of which is incorporated herein by reference in its entirety.

TECHNICAL FIELD

The present disclosure relates to a semiconductor package.

BACKGROUND

In accordance with improvement of specifications of a set and use of a high bandwidth memory (HBM), an interposer market has grown. Currently, silicon has been mainly used as a material of the interposer, but development of a glass or organic interposers has been conducted in order to increase an area and reduce a cost. A connecting portion connecting the interposer to a mainboard, or the like, of the set, is called an underbump metallurgy (UBM) layer, and reliability of the connecting portion is significantly affected by a structure of the UBM layer, and the structure of the UBM layer thus needs to be optimized.

Particularly, various surface treatment processes have been performed on the UBM layer in order to improve bonding reliability. Electroplating is mainly used as the surface treatment as described above. In this case, processes of forming and removing plating lead lines are required, and a limitation in a design of a circuit pattern and a problem such as complexity of processes may thus occur.

SUMMARY

An aspect of the present disclosure may provide a semiconductor package having a structure of an underbump metallurgy (UBM) layer in which a process may be simplified and a fine pitch may be implemented.

According to an aspect of the present disclosure, a semiconductor package may be provided, in which a plating layer is embedded in a passivation layer in a final package structure in a reverse sequence plating manner of first forming a surface treatment layer of a UBM layer.

According to an aspect of the present disclosure, a semiconductor package may include: a semiconductor chip having an active surface having connection pads disposed thereon; a connection member disposed on the active surface of the semiconductor chip and including a redistribution layer electrically connected to the connection pads; a passivation layer disposed on the connection member; and a UBM layer embedded in the passivation layer and electrically connected to the redistribution layer of the connection member, wherein the UBM layer includes a UBM pad embedded in the passivation layer, at least one plating layer disposed on the UBM pad and having side surfaces of which at least portions are covered by the UBM pad, and a UBM via penetrating through at least portions of the passivation layer and electrically connecting the redistribution layer of the connection member and the UBM pad to each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
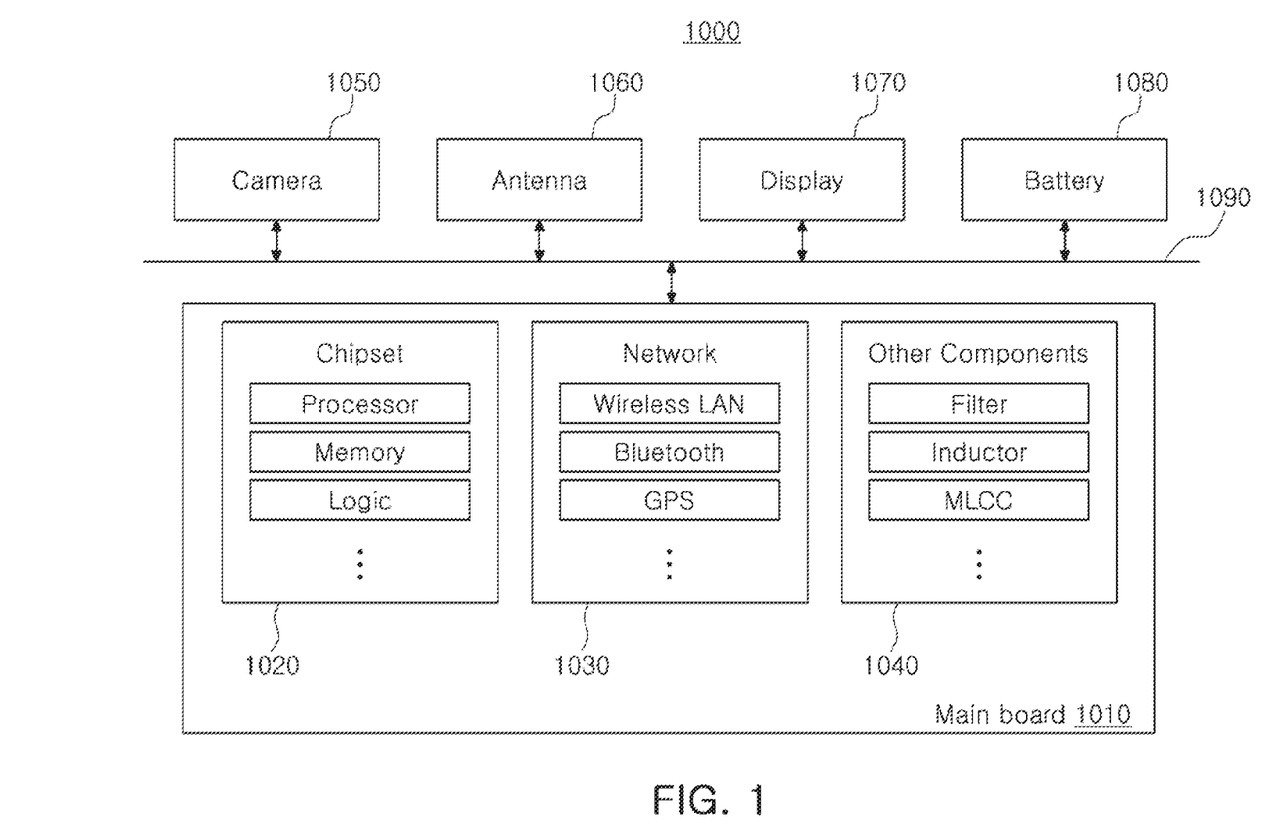
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
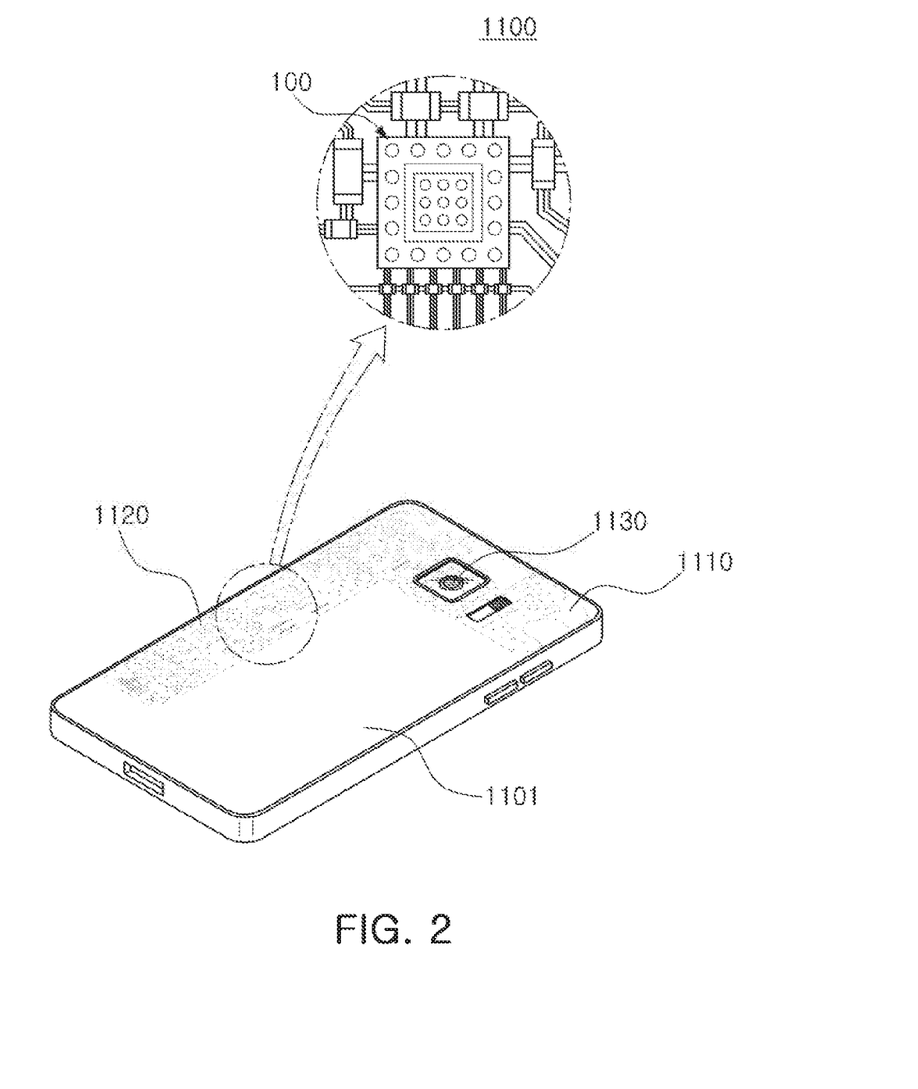
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various electronic components 1120 may be physically or electrically connected to the mainboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology described above will hereinafter be described in more detail with reference to the drawings.

Figure 3:
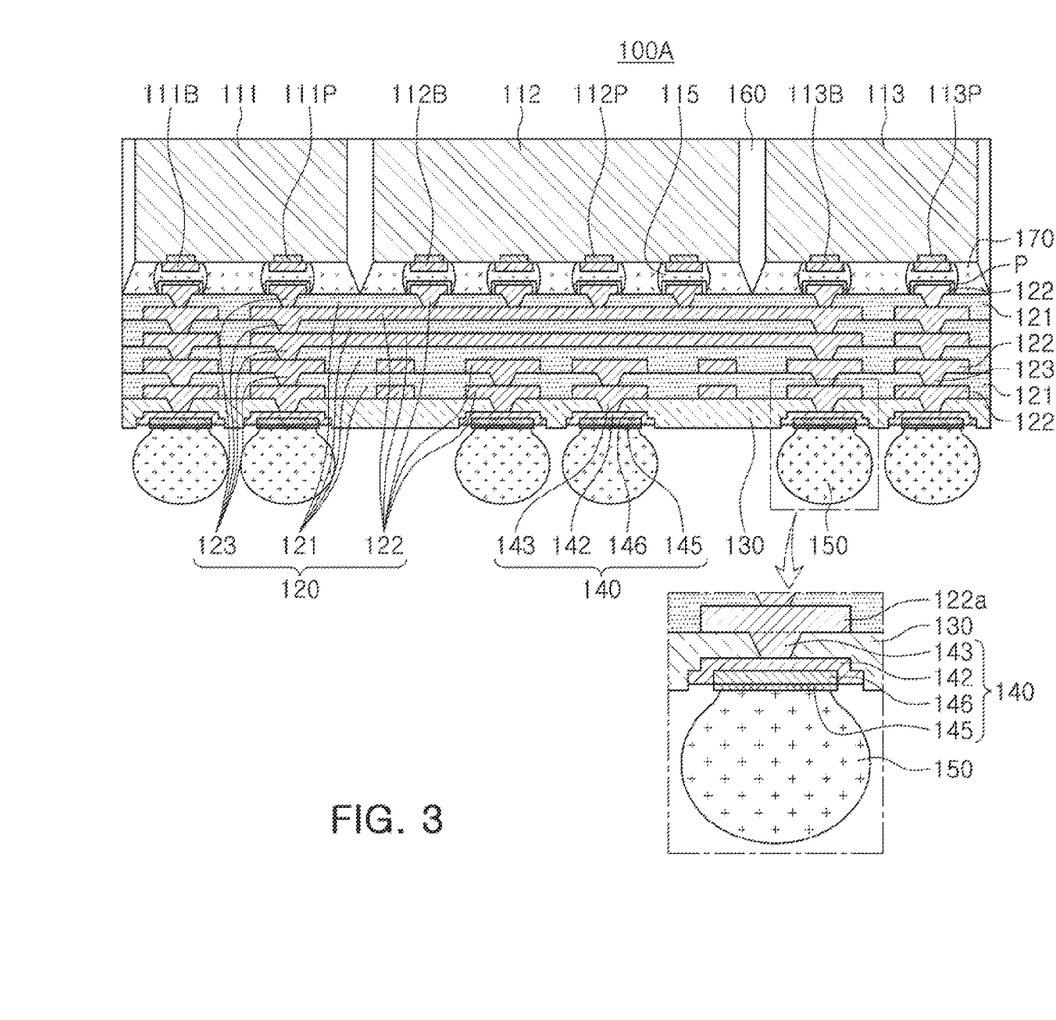
FIG. 3 is a schematic cross-sectional view illustrating an example of a semiconductor package.

FIG. 3 is a schematic cross-sectional view illustrating an example of a semiconductor package.

Referring to FIG. 3, a semiconductor package 100A according to an exemplary embodiment in the present disclosure may include semiconductor chips 111, 112, and 113 having active surfaces having connection pads 111P, 112P, and 113P disposed thereon, respectively, an encapsulant 160 encapsulating at least portions of the semiconductor chips 111, 112, and 113, a connection member 120 disposed on the active surfaces of the semiconductor chips 111, 112, and 113 and including a redistribution layer 122 electrically connected to the respective connection pads 111P, 112P, and 113P, a passivation layer 130 disposed on the connection member 120, UBM layers 140 embedded in the passivation layer 130 and electrically connected to a redistribution layer 122 of the connection member 120, and connection terminals 150 connected to the UBM layers 140. The UBM layer 140 may include a UBM pad 142 embedded in the passivation layer 130, a UBM via 143 embedded in the passivation layer 130 and electrically connecting the redistribution layer 122 of the connection member 120 and the UBM pad 142 to each other, and first and second plating layers 145 and 146 embedded in the passivation layer 130 and disposed on the UBM pad 142. The connection terminals 150 may be disposed on the first plating layer 145 disposed at the outermost portion. The UBM pad 142 may be bent at at least one end thereof along side surfaces of the first and second plating layers 145 and 146, and at least portions of the side surfaces of the first and second plating layers 145 and 146 may be covered by the UBM pad 142. A lower surface of the first plating layer 145 may be disposed on the same level as that of a lower surface of the passivation layer 130, and a lower surface of the UBM pad 142 may be disposed on a level above the lower surface of the passivation layer 130. That is, the lower surface of the UBM pad 142 may be recessed inwardly of the passivation layer 130.

In an interposer according to the related art, a redistribution layer is formed on an insulating layer, a package process of attaching a die to the redistribution layer and molding the die is performed, a package is separated from a carrier, and a UBM layer is formed on a lower surface of the package in contact with the carrier by processes such as a process of forming vias, an exposing process, a plating process, and the like. Such a method according to the related art is generally called a UBM layer last method since the UBM layer is last formed. In the UBM layer last method, it is difficult to perform a process due to warpage in the package. Therefore, a separate carrier needs to be further used, and a dedicated line for a process of forming the UBM layer needs to be built up. In addition, products passing through a package line having low cleanliness again pass through the exposing process and the plating process having high cleanliness, and a risk of process quality, a risk of a yield reduction, or the like, thus exists. Generally, when the UBM layer last method is used, UBM pads are formed on a passivation layer, and UBM vias are formed along via holes formed in the passivation layer.

Meanwhile, the semiconductor package 100A according to the exemplary embodiment may be manufactured by a UBM layer first method as seen from processes to be described below. That is, the UBM layer 140 and the passivation layer 130 may be formed on a line forming the connection member 120 before the connection member 120 is formed. Therefore, an additional carrier is not required, the dedicated line for forming the UBM layer may be omitted, and a risk due to foreign materials after a package process may be removed. In this process, the UBM layer 140 may be embedded in the passivation layer 130. Therefore, the lower surface of the first plating layer 145 may be disposed on the same level as that of the lower surface of the passivation layer 130. The term "same level" means that surfaces are substantially coplanar with each other, and a slight flexion, or the like, depending on processes is ignored. Particularly, since the first and second plating layers 145 and 146 corresponding to a surface treatment layer of the UBM pad 142 are first formed, and processes of forming and removing plating lead lines are not required, and the UBM layer 140 may be formed without having a limitation in a design due to the plating lead lines, such that a fine pitch may be implemented.

Meanwhile, in the semiconductor package 100A according to the exemplary embodiment, a width of an upper surface of the UBM via 143 in contact with the redistribution layer 122 of the connection member 120 may be greater than that of a lower surface thereof in contact with the UBM pad 142. Here, the width is decided in relation to a cross-sectional view. When the UBM layer last method is used as in the related art, a width of an upper surface of the UBM via is generally smaller than that of a lower surface thereof. On the other hand, in the semiconductor package 100A according to the exemplary embodiment, the UBM layer first method is used, and the UBM via 143 may thus be formed in a reverse trapezoidal shape in which the width of the upper surface thereof is greater than that of the lower surface thereof. In addition, since the UBM pad 142 and the UBM via 143 are formed like the redistribution layer 122 and a via 123 of the connection member 120, the UBM via 143 may be an approximately filled-via.

The respective components included in the semiconductor package 100A according to the exemplary embodiment will hereinafter be described below in more detail.

Each of the semiconductor chips 111, 112, and 113 may be, for example, a processor chip such as a central processor (for example, a CPU), a graphic processor (for example, a GPU), a field programmable gate array (FPGA), a digital signal processor, a cryptographic processor, a micro processor, a micro controller, or the like, be a logic chip such as an analog-to-digital converter, an application-specific IC (ASIC), or the like, or be a memory chip such as a volatile memory (for example, a DRAM), a non-volatile memory (for example, a ROM), a flash memory, a high bandwidth memory (HBM), or the like. In addition, the abovementioned elements may also be combined with each other and be disposed. As a non-restrictive example, a first semiconductor chip 111 and a third semiconductor chip 113 may be a memory chip such as an HBM, or the like, and a second semiconductor chip 112 may be a processor chip such as an AP. However, the first to third semiconductor chips 111 to 113 are not limited thereto.

The semiconductor chips 111, 112, and 113 may be an integrated circuit (IC) provided in an amount of several hundred to several million or more elements integrated in a single chip. In this case, a base material of a body of each of the semiconductor chips may be silicon (Si), germanium (Ge), gallium arsenide (GaAs), or the like. Various circuits may be formed on each of the bodies. The connection pads 111P, 112P, and 113P of the semiconductor chips 111, 112, and 113 may electrically connect the semiconductor chips 111, 112, and 113 to other components.

A material of each of the connection pads 111P, 112P, and 113P may be a conductive material such as aluminum (Al), or the like. A passivation layer exposing the connection pads 111P, 112P, and 113P may be formed on each of the bodies, and may be an oxide film, a nitride film, or the like, or a double layer of an oxide layer and a nitride layer. An insulating layer, and the like, may also be further disposed in required positions. Redistribution layers may further be formed on the active surfaces of the semiconductor chips 111, 112, and 113, if necessary, and bumps 111B, 112B, and 113B, or the like, may also be connected to the connection pads 111P, 112P, and 113P, respectively. The bumps 111B, 112B, and 113B may be formed of a metal or a solder. The semiconductor chips 111, 112, and 113 may be connected to an exposed upper redistribution layer 122c of the connection member 120 through the connection pads 111P, 112P, and 113P and/or the bumps 111B, 112B, and 113B, and connection members 115 such as solders, or the like, may be used for the connection. The respective semiconductor chips 111, 112, and 113 may be fixed onto the connection member 120 by any known underfill resin 170.

The connection member 120 may redistribute the connection pads 111P, 112P, and 113P of the semiconductor chips 111, 112, and 113. Several tens to several hundreds of connection pads 111P, 112P, and 113P of each of the semiconductor chips 111, 112, and 113 having various functions may be redistributed by the connection member 120, and may be physically or electrically externally connected through the connection terminals 150 depending on the functions. The connection member 120 may include insulating layers 121, the redistribution layers 122 formed on or in the insulating layers 121, and the vias 123 penetrating through the insulating layers 121 and electrically connecting the redistribution layers 122 formed on different layers to each other. The number of layers of the connection member 120 may be more than that illustrated in the drawing or be less than that illustrated in the drawing. The connection member 120 having such a form may be used as a 2.5D type organic interposer.

The connection member 120 may include a first insulating layer 121a in contact with the passivation layer 130, a first redistribution layer 122a embedded in the first insulating layer 121a and in contact with the passivation layer 130 and the UBM vias 143, a second redistribution layer 122b disposed on the first insulating layer 121a, and first vias 123a penetrating through at least portions of the first insulating layer 121a and electrically connecting the first redistribution layer 122a and the second redistribution layer 122b to each other. The connection member 120 may be formed by configuring insulating layers, redistribution layers, and vias having such a form as multiple layers. The connection member 120 may include a second insulating layer 121b in contact with an encapsulant 160 and/or an underfill resin 170 and a third redistribution layer 122c disposed on the second insulating layer 121b.

For example, an insulating material may be used as a material of each of the insulating layers 121. In this case, a thermosetting resin such as an epoxy resin, a thermoplastic resin such as a polyimide resin, a resin in which the thermosetting resin and the thermoplastic resin are mixed with an inorganic filler, for example, Ajinomoto build-up film (ABF), or the like, may be used as the insulating material. Alternatively, a photosensitive insulating material such as a photoimagable dielectric (PID) resin may be used the insulating material. That is, each of the insulating layers 121 may be a photosensitive insulating layer. When the insulating layer 121 has photosensitive properties, the insulating layer 121 may be formed to have a smaller thickness, and a fine pitch of the via 123 may be achieved more easily. When the insulating layers 121 are multiple layers, materials of the insulating layers 121 may be the same as each other, and may also be different from each other, if necessary. When the insulating layers 121 are the multiple layers, the insulating layers 121 may be integrated with each other depending on a process, such that a boundary therebetween may also not be apparent.

The redistribution layers 122 may serve to substantially redistribute the connection pads 111P, 112P, and 113P. A material of each of the redistribution layers 122 may be a conductive material such as copper (Cu), aluminum (Al), silver (Ag), tin (Sn), gold (Au), nickel (Ni), lead (Pb), titanium (Ti), or alloys thereof. The redistribution layers 122 may perform various functions depending on designs of corresponding layers. For example, the redistribution layers 122 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 122 may include via pads, connection terminal pads, and the like. A surface treatment layer P may be formed on a surface of the third redistribution layer 122c serving as pads for mounting the semiconductor chips 111, 112, and 113 among the redistribution layers 122. The surface treatment layer P is not particularly limited as long as it is compatible with other materials and processes used in manufacturing the package, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The vias 123 may electrically connect the redistribution layers 122, and the like, formed on different layers to each other, resulting in an electrical path in the semiconductor package 100A. A material of each of the vias 123 may be a conductive material such as copper (Cu), aluminum (Al), silver (Ag), tin (Sn), gold (Au), nickel (Ni), lead (Pb), titanium (Ti), or alloys thereof. The vias 123 may be completely filled with a conductive material, but are not limited thereto. A cross-sectional shape of each of the vias 123 may be an approximately reverse trapezoidal shape in the drawing.

The passivation layer 130 may protect the connection member 120 from external physical or chemical damage. A material of the passivation layer 130 is not particularly limited. For example, an insulating material may be used as the material of the passivation layer 130. In this case, the insulating material may be the material described as the insulating material of the insulating layer 121 of the connection member 120 described above, for example, an ABF.

The UBM layer 140 may improve connection reliability of the connection terminal 150 to improve board level reliability of the semiconductor package 100A. The UBM layer 140 may include the UBM pad 142 embedded in the passivation layer 130, the UBM via 143 embedded in the passivation layer 130 and electrically connecting the redistribution layer 122 of the connection member 120 and the UBM pad 142 to each other, and the first and second plating layers 145 and 146 embedded in the passivation layer 130 and disposed on portions of the UBM pad 142. At least portions of the first plating layer 145 may protrude from the UBM pad 142. Portions of the second plating layer 146 may also protrude from the UBM pad 142. The lower surface of the first plating layer 145 may be disposed on the same level as that of the lower surface of the passivation layer 130. The term "same level" means that surfaces are coplanar with each other, and a slight flexion, or the like, depending on processes is ignored. The connection terminal 150 may be disposed on the first plating layer 145, and may protrude on the passivation layer 130. The UBM pad 142 may be bent and be extended at at least one end thereof along the side surfaces of the first and second plating layers 145 and 146, and at least portions of the side surfaces of the first and second plating layers 145 and 146 may be covered by the UBM pad 142.

The first and second plating layers 145 and 146 may correspond to a surface treatment layer of the UBM pad 142. A material of each of the first and second plating layers 145 and 146 may be a conductive material such as copper (Cu), aluminum (Al), silver (Ag), tin (Sn), gold (Au), nickel (Ni), lead (Pb), titanium (Ti), or alloys thereof. For example, the first plating layer 145 may be a gold (Au) plating layer, and prevent oxidation of the UBM pad 142. The second plating layer 146 may be formed of a material different from that of the first plating layer 145, and may be, for example, a nickel (Ni) plating layer. The second plating layer 146 may prevent formation of an intermetallic compound by the first plating layer 145 and the UBM pad 142. However, the number of layers constituting the first and second plating layers 145 and 146 is not limited thereto. In the present exemplary embodiment, a case in which a structure of the first and second plating layers 145 and 146 and the UBM pad 142 is applied to the UBM layer 140 is described, but in exemplary embodiments of the semiconductor packages, such a structure may be variously applied to bonding pads to which solders or bumps are connected.

The width of the upper surface of the UBM via 143 in contact with the redistribution layer 122 of the connection member 120 may be greater than that of the lower surface thereof in contact with the UBM pad 142. Here, the width is decided in relation to a cross-sectional view. When the UBM layer last method is used as in the related art, a width of an upper surface of the UBM via is generally smaller than that of a lower surface thereof. On the other hand, in the semiconductor package 100A according to the exemplary embodiment, the UBM layer first method is used, and the UBM via 143 may thus be formed in a reverse trapezoidal shape in which the width of the upper surface thereof is greater than that of the lower surface thereof. In addition, since the UBM pad 142 and the UBM via 143 are formed like the redistribution layer 122 and the via 123 of the connection member 120, the UBM via 143 may be an approximately filled-via. The upper surface of the UBM via 143 may be disposed on a level that is substantially the same as that of an upper surface of the passivation layer 130. The term "same level" means that surfaces are coplanar with each other, and a slight flexion, or the like, depending on processes is ignored.

The connection terminals 150 may physically or electrically externally connect the semiconductor package 100A. For example, the semiconductor package 100A may be mounted on the mainboard of the electronic device through the connection terminals 150. Each of the connection terminals 150 may be formed of a conductive material, for example, a solder, or the like. However, this is only an example, and a material of each of the connection terminals 150 is not particularly limited thereto. Each of the connection terminals 150 may be a land, a ball, a pin, or the like. The connection terminals 150 may be formed as a multilayer or single layer structure. When the connection terminals 150 are formed as a multilayer structure, the connection terminals 150 may include a copper (Cu) pillar and a solder. When the connection terminals 150 are formed as a single layer structure, the electrical connection terminals 150 may include a tin-silver solder or copper (Cu). However, this is only an example, and the connection terminals 150 are not limited thereto.

The number, an interval, a disposition, or the like, of the connection terminals 150 is not particularly limited, but may be sufficiently modified by a person skilled in the art depending on design particulars. For example, the connection terminals 150 may be provided in an amount of several tens to several thousands according to the numbers of connection pads 111P, 112P, and 113P, or may be provided in an amount of several tens to several thousands or more or several tens to several thousands or less. Some of the connection terminals 150 may be disposed in a fan-out region. The fan-out region refers to a region except for a region in which the semiconductor chips 111, 112, and 113 are disposed. That is, the semiconductor package 100A according to the exemplary embodiment may be a fan-out semiconductor package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The encapsulant 160 may protect the semiconductor chips 111, 112, and 113, and the like. An encapsulation form of the encapsulant 160 is not particularly limited, but may be a form in which the encapsulant 160 surrounds at least portions of the semiconductor chips 111, 112, and 113. A material of the encapsulant 160 is not particularly limited. For example, an insulating material maybe used as the material of the encapsulant 160. In this case, a thermosetting resin such as an epoxy resin, a thermoplastic resin such as a polyimide resin, a resin in which the thermosetting resin and the thermoplastic resin are mixed with an inorganic filler, for example, ABF, or the like, may be used as the insulating material. However, the material of the encapsulant 160 is not limited thereto, but may also be prepreg, or the like, including a glass fiber. Alternatively, any known epoxy molding compound (EMC), or the like, may also be used as the material of the encapsulant 160.

The underfill resin 170 may fix the semiconductor chips 111, 112, and 113 onto the connection member 120. Any known material including epoxy, or the like, may be used as a material of the underfill resin 170. The underfill resin 170 may be omitted, if necessary. Meanwhile, although not illustrated in the drawings, passive components may also be disposed and packaged side-by-side with the semiconductor chips 111, 112, and 113 on the connection member 120, if necessary.

Figure 4A:
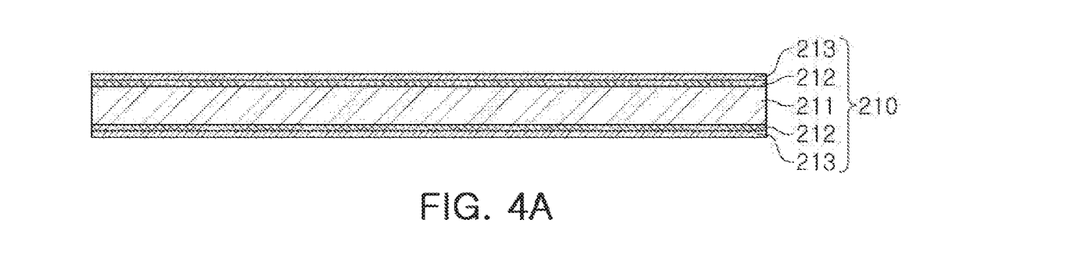
FIGS. 4A and 4K are schematic views illustrating an example of processes of forming the semiconductor package of FIG. 3.
Figure 4B:
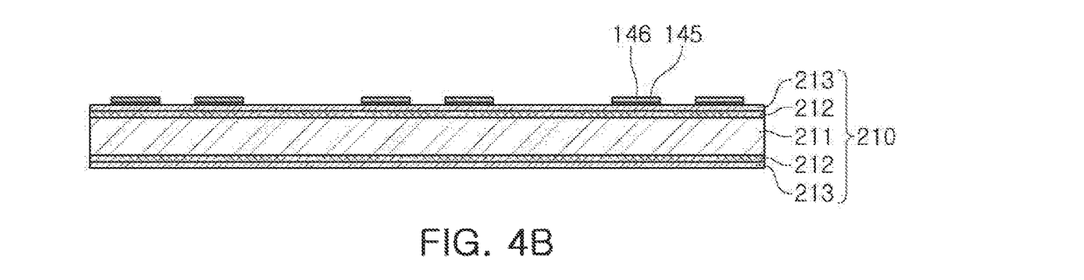
Figure 4C:
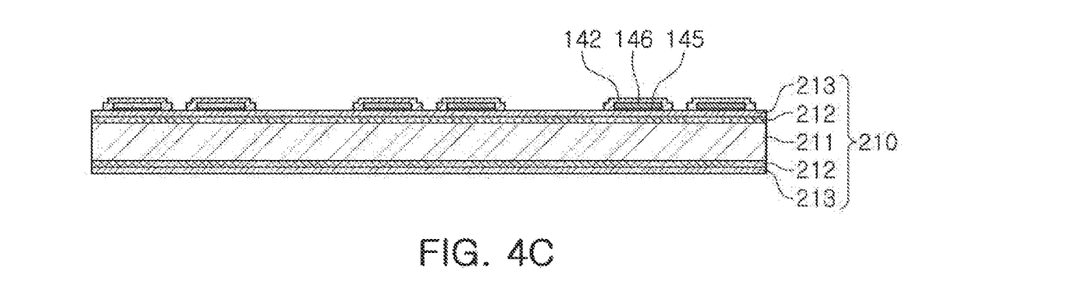
Figure 4D:
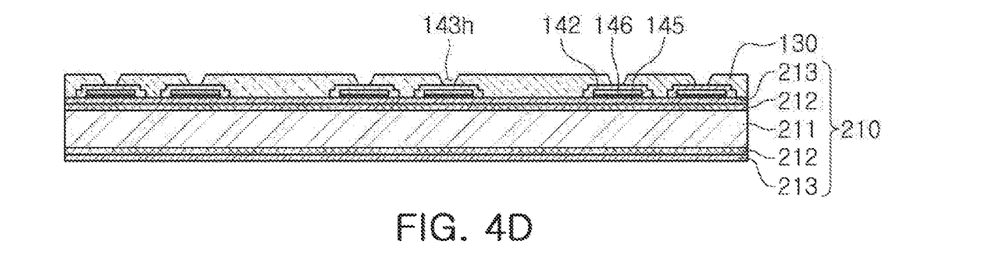
Figure 4E:
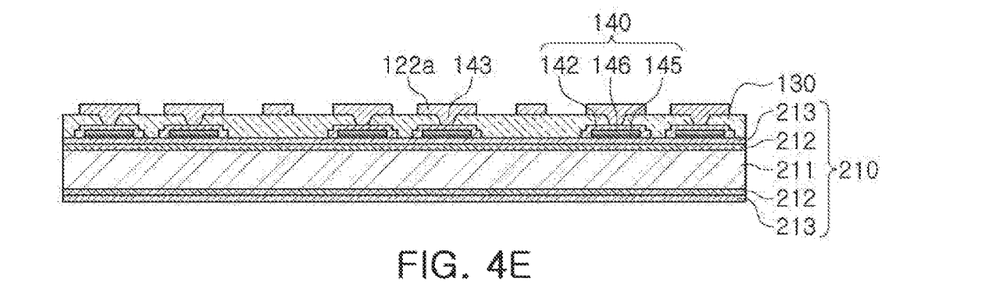
Figure 4F:
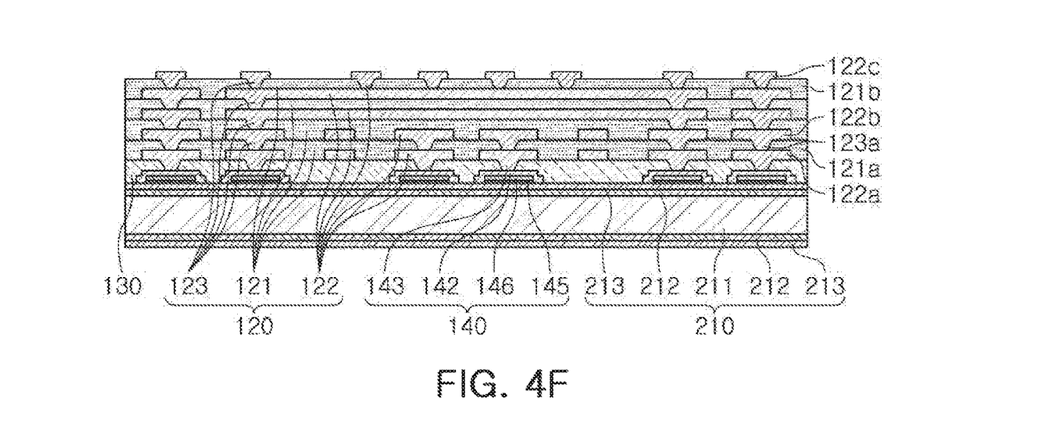
Figure 4G:
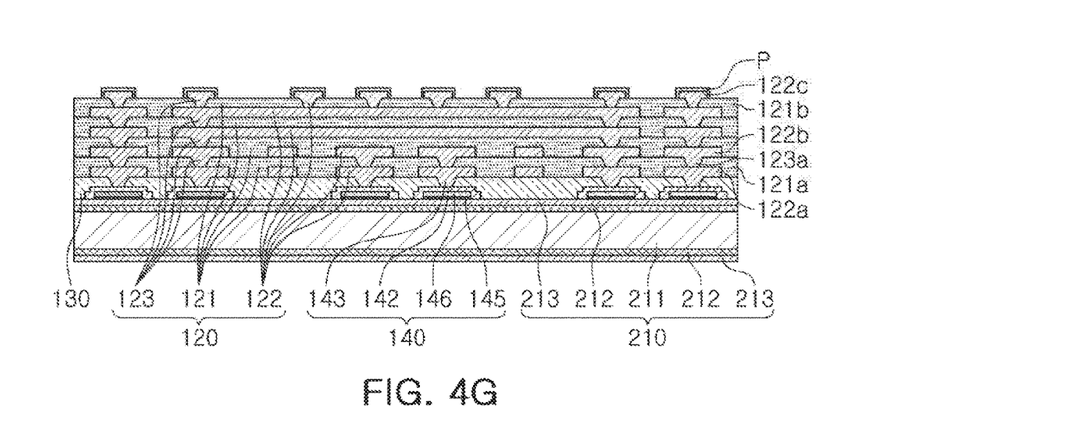
Figure 4H:
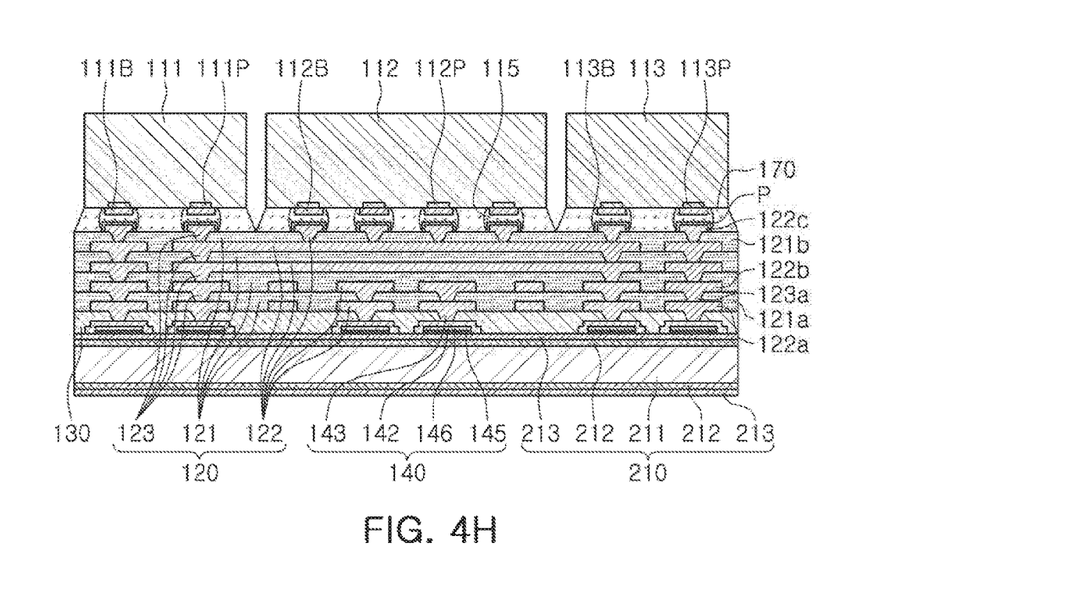
Figure 4I:
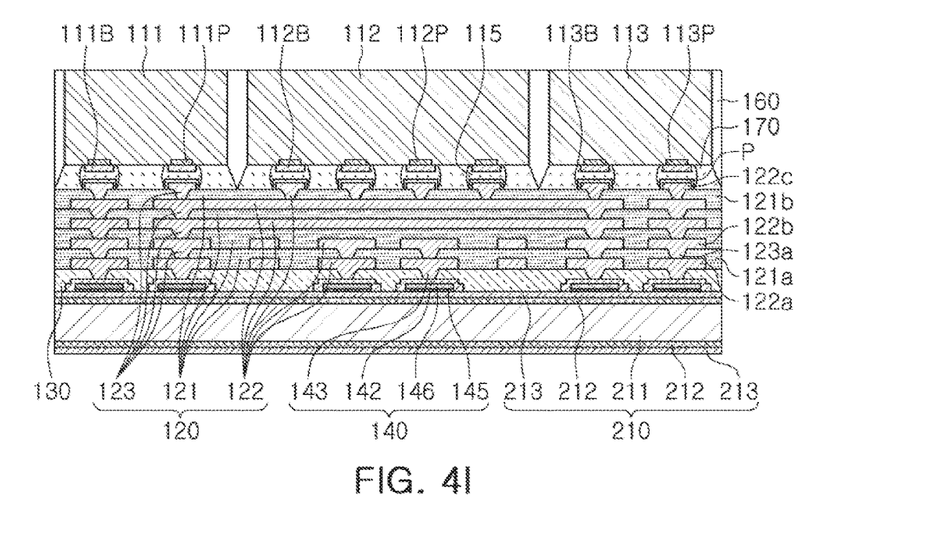
Figure 4J:
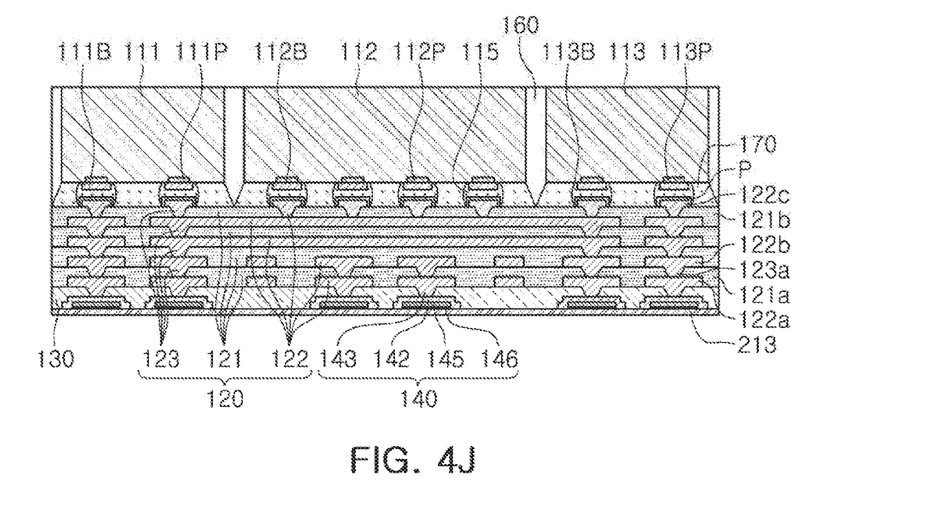
Figure 4K:
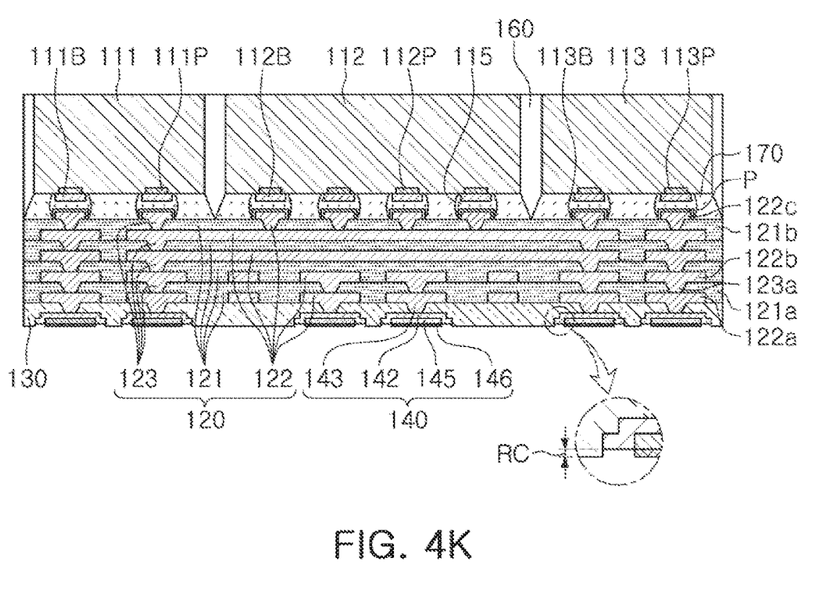

FIGS. 4A and 4K are schematic views illustrating an example of processes of forming the semiconductor package of FIG. 3.

Referring to FIG. 4A, a carrier 210 may be prepared. The carrier 210 may include a core layer 211 and metal layers 212 and 213 formed on the core layer 211. The core layer 211 may be formed of, for example, prepreg including an insulating resin, an inorganic filler, and a glass fiber. The metal layers 212 and 213 may include a metal such as copper (Cu), titanium (Ti), or the like. Surface treatment may be performed between the metal layers 212 and 213 so that the metal layers 212 and 213 are easily separated from each other. Alternatively, a release layer may be provided between the metal layers 212 and 213. The carrier 210 may be a general detach core. A separate resin layer may further be formed on the carrier 210, if necessary.

Referring to FIG. 4B, the first and second plating layers 145 and 146 may be sequentially formed on the metal layer 213. The first and second plating layers 145 and 146 may be formed on only an upper surface of the carrier 210 or be formed on upper and lower surfaces of the carrier 210. The first and second plating layers 145 and 146 may be formed by forming patterns using a dry film, or the like, and then filling the patterns by a plating process. Since the first and second plating layers 145 and 146 are formed on the metal layer 213, processes of forming and removing plating lead lines, which are seed layers, are not required. Particularly, the first and second plating layers 145 and 146 may be formed by electroplating, and a defect such as bleeding of a plating solution to the surrounding of patterns that may occur when the first and second plating layers 145 and 146 are formed by electroless plating may be prevented. The second plating layer 146 may be formed in a region wider than that of the first plating layer 145. In this case, the second plating layer 146 may be formed by again forming patterns and performing a plating process, after the first plating layer 145 is formed.

Referring to FIG. 4C, the UBM pads 142 covering the first and second plating layers 145 and 146 may be formed. The UBM pads 142 may be formed by forming patterns using a dry film, or the like, and then filling the patterns by a plating process. The UBM pad 142 may be formed to be bent along at least one ends of the first and second plating layers 145 and 146. The UBM pads 142 may also be formed in regions in which the first and second plating layers 145 and 146 are not formed in regions that are not illustrated, and may be electrically connected to portions formed on the first and second plating layers 145 and 146. In this case, the UBM pads 142 may serve as a redistribution layer.

Referring to FIG. 4D, the passivation layer 130 may be formed, and via holes 143h exposing the UBM pads 142 may be formed by patterning the passivation layer 130. The passivation layer 130 may be formed by a lamination method, an applying method, or the like, but is not limited thereto, and the via holes 143h may be formed by a photolithography method, mechanical drilling, laser drilling, or the like, but are not limited thereto.

Referring to FIG. 4E, the UBM vias 143 filling the via holes 143h and connected to the UBM pads 142 may be formed, and the first redistribution layer 122a connected to the UBM vias 143 may be formed on the passivation layer 130. The UBM vias 143 and the first redistribution layer 122a may be formed by a plating process, or the like. Resultantly, the UBM layer 140 may be formed.

Referring to FIG. 4F, components other than the first redistribution layer 122a may further be formed on the passivation layer 130 and the UBM layer 140 to form the connection member 120. The connection member 120, the passivation layer 130, and the UBM layer 140 may be continuously formed on the same line. The insulating layer 121 may also be formed by laminating or applying a PID, or the like. The redistribution layer 122 and the vias 123 may be formed by forming patterns using a dry film, or the like, and then filling the patterns by a plating process. The plating process may be a subtractive process, an additive process, a semi-additive process (SAP), a modified semi-additive process (MSAP), or the like, but is not limited thereto. In a process according to another exemplary embodiment, as illustrated in FIG. 4C, the carrier 210 on which the UBM pads 142 are formed may be coupled to the manufactured connection member 120 to manufacture a semiconductor package.

Referring to FIG. 4G, the surface treatment layer P, or the like, may be formed on the third redistribution layer 122c formed at an upper portion of the connection member 120. Then, a quad route test, an electrical test of the redistribution layers 122, and the like, may be performed, if necessary.

Referring to FIG. 4H, the semiconductor chips 111, 112, and 113 may be mounted on the connection member 120. The connection members 115 such as the solders, or the like, may be used to mount the semiconductor chips 111, 112, and 113 on the interposer 120. Then, the semiconductor chips 111, 112, and 113 may be fixed by the underfill resin 170.

Referring to FIG. 4I, the encapsulant 160 encapsulating the semiconductor chips 111, 112, and 113 may be formed on the connection member 120. The encapsulant 160 may be formed by laminating a film form or applying or hardening a liquid phase form. Meanwhile, grinding may be performed on the encapsulant 160, if necessary. The upper surfaces of the semiconductor chips 111, 112, and 113 may be disposed on the same level by the grinding. That is, thicknesses of the semiconductor chips 111, 112, and 113 may become substantially the same as each other.

Referring to FIG. 4J, the carrier 210 may be separated from the connection member 120 and the semiconductor chips 111, 112, and 113. A process of separating the carrier 210 may be performed by separation of the metal layers 212 and 213.

Referring to FIG. 4K, the metal layer 213 may be removed by an etching process. The first plating layer 145 and the UBM pads 142 may be exposed due to the removal of the metal layer 213. The UBM pad 142 may also be partially removed from the lower surface of the passivation layer at the time of removing the metal layer 213. Therefore, the UBM pad 142 may be recessed at a predetermined depth RC from the lower surface of the passivation layer 130, such that the lower surface of the UBM pad 142 may be disposed on a relatively high level.

Then, referring back to FIG. 3, a process of attaching the connection terminals 150 and a reflow process may be performed. The semiconductor package 100A according to the exemplary embodiment may be manufactured through a series of processes.

Figure 5:
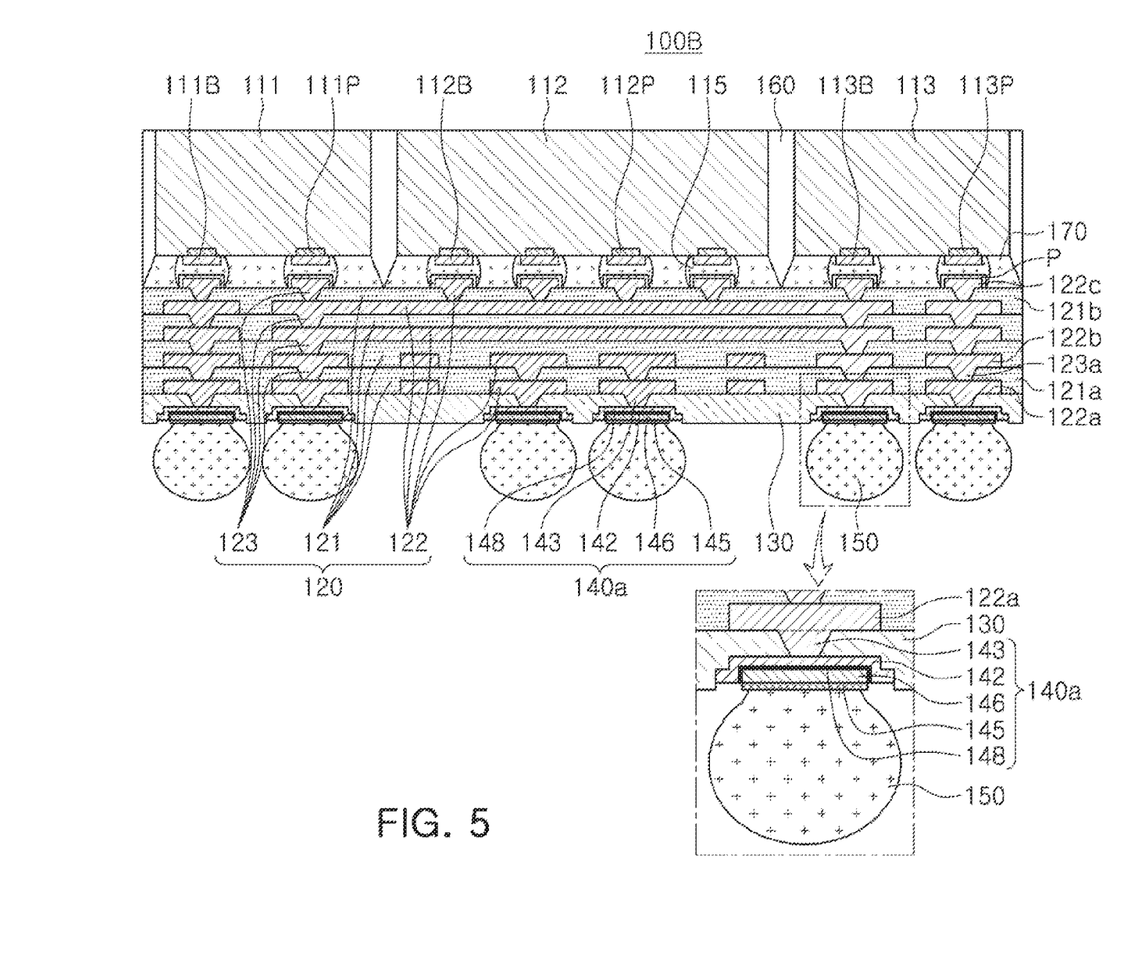
FIG. 5 is a schematic cross-sectional view illustrating another example of a semiconductor package.

FIG. 5 is a schematic cross-sectional view illustrating another example of a semiconductor package.

Referring to FIG. 5, in a semiconductor package 100B according to another exemplary embodiment in the present disclosure, a UBM layer 140a may further include a barrier layer 148, in addition to a UBM pad 142, a UBM via 143, first and second plating layers 145 and 146. The barrier layer 148 may be formed of a conductive material, and may be formed of a material different from that of the first and second plating layers 145 and 146. A material of the barrier layer 148 may be a conductive material such as copper (Cu), aluminum (Al), silver (Ag), tin (Sn), gold (Au), nickel (Ni), lead (Pb), titanium (Ti), or alloys thereof. Formation of an intermetallic compound between the UBM pad 142 and the first and second plating layers 145 and 146 may be prevented by the barrier layer 148. In addition, adhesion between the UBM pad 142 and the first and second plating layers 145 and 146 may be improved by the barrier layer 148, such that damage to the first and second plating layers 145 and 146 when the carrier 210 is separated in a manufacturing process may be prevented. The barrier layer 148 may be recessed together with the UBM pad 142 from a lower surface of the passivation layer in the manufacturing process, such that a lower surface of the barrier layer 148 may be disposed on a level above the first plating layer 145. However, the barrier layer 148 is not limited thereto.

Other configurations, for example, contents described with reference to FIGS. 3 through 4K may be applied to the semiconductor package 100B according to another exemplary embodiment, and a detailed description thereof overlaps that described above, and is thus omitted.

Figure 6:
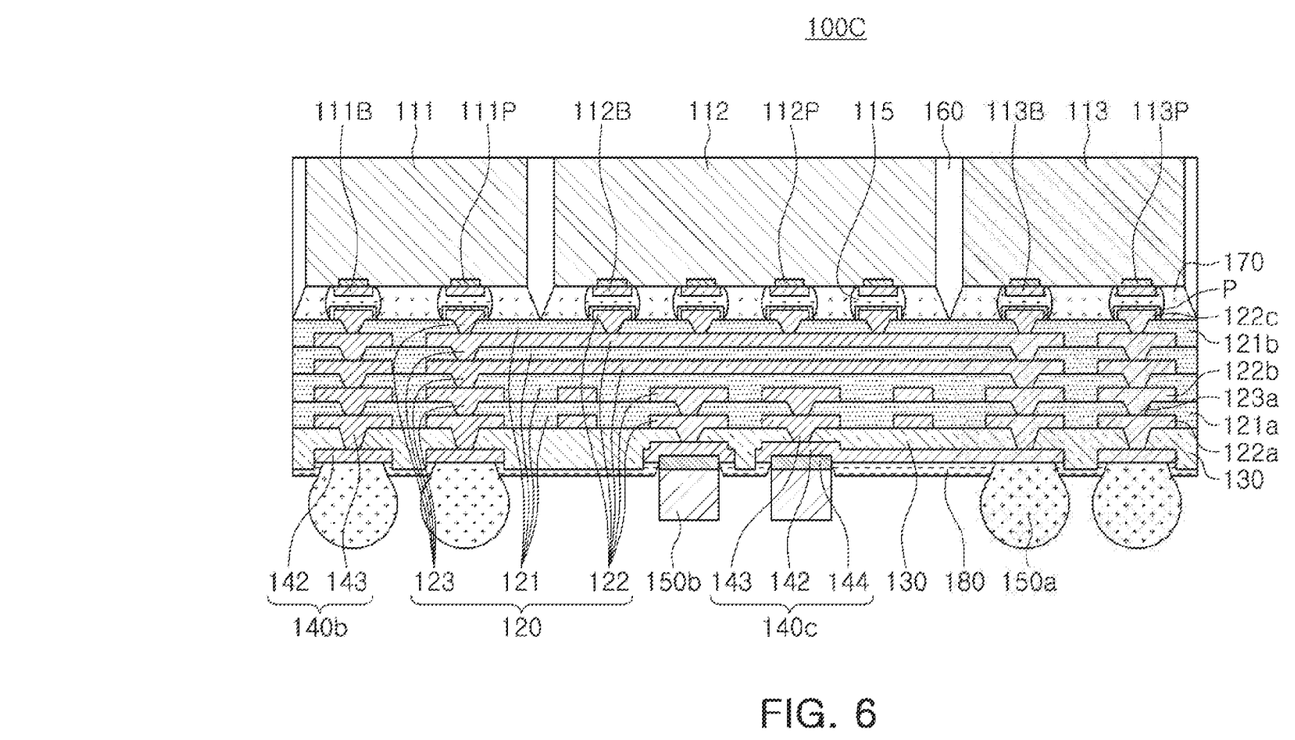
FIG. 6 is a schematic cross-sectional view illustrating another example of a semiconductor package.

FIG. 6 is a schematic cross-sectional view illustrating another example of a semiconductor package.

Referring to FIG. 6, in a semiconductor package 100C according to another exemplary embodiment in the present disclosure, UBM layers 140*b* and 140*c* may have two structures. In addition, a solder resist layer 180 may further be disposed on the UBM layers 140*b* and 140*c*. A first UBM layer 140*b* may include a UBM pad 142 embedded in a passivation layer 130 and a UBM via 143 embedded in the passivation layer 130 and electrically connecting a redistribution layer 122 of a connection member 120 and the UBM pad 142 to each other. A second UBM layer 140*c* may further include a plating layer 144, in addition to a UBM pad 142 and a UBM via 143. A first connection terminal 150*a* may be connected to the first UBM layer 140*b*, a second connection terminal 150*b* may be connected to the second UBM layer 140*c*, and the second connection terminal 150*b* may have a form different from that of the first connection terminal 150*a* and be formed of a material different from that of the first connection terminal 150*a*. That is, in the semiconductor package 100C, the plating layer 144 may be formed on only some of the UBM pads 142 depending on purposes of bonding pads.

The plating layer 144 of the second UBM layer 140*c* may correspond to a surface treatment layer of the UBM pad 142. A material of the plating layer 144 may be a conductive material such as copper (Cu), aluminum (Al), silver (Ag), tin (Sn), gold (Au), nickel (Ni), lead (Pb), titanium (Ti), or alloys thereof. For example, the plating layer 144 may be a tin (Sn) plating layer, and may be a layer for soldering. The plating layer 144 may include a single layer or a plurality of layers. The UBM pad 142 may be bent at at least one end thereof along side surfaces of the plating layer 144, and at least portions of the side surfaces of the plating layer 144 may be covered by the UBM pad 142. A lower surface of the plating layer 144 may be disposed on the same level as that of a lower surface of the passivation layer 130, and a lower surface of the UBM pad 142 may be disposed on a level above the lower surface of the passivation layer 130. That is, the lower surface of the UBM pad 142 may be disposed inside the passivation layer 130. However, the plating layer 144 and the UBM pad 142 are not limited thereto. The UBM pad 142 of the first UBM layer 140*b* may be electrically and/or physically connected to the UBM pad 142 of the second UBM layer 140*c*. In the semiconductor package 100C, the UBM pads 142 may serve as a redistribution layer, and may constitute circuit patterns or may be connected to each other between adjacent connection terminals 150*a* and 150*b* as illustrated in FIG. 6.

The first connection terminal 150*a* disposed on the first UBM layer 140*b* may be a solder, and the second connection terminal 150*b* disposed on the second UBM layer 140*c* may be, for example, a copper post. Any one of the first and second UBM layers 140*b* and 140*c* may be selectively disposed depending on a type of connection terminals 150*a* and 150*b* connected thereto. When the plating layer 144 of the second UBM layer 140*c* is formed of a solder, the second connection terminal 150*b*, which is the copper post, may be directly connected to the second UBM layer 140*c*. A relative disposition of the connection terminals 150*a* and 150*b* and a disposition of the first and second UBM layers 140*b* and 140*c* depending on the relative disposition of the connection terminals 150*a* and 150*b* are not limited to those illustrated in FIG. 6.

The solder resist layer 180 may further be disposed on the UBM pads 142 and the passivation layer 130 to protect the UBM pads 142. Therefore, the connection terminals 150*a* and 150*b* may be disposed to protrude outwardly of the solder resist layer 180. The solder resist layer 180 may be formed of, for example, a photosensitive resin. The solder resist layer 180 may also be omitted, if necessary.

Other configurations, for example, contents described with reference to FIGS. 3 through 4K may be applied to the semiconductor package 100C according to another exemplary embodiment, and a detailed description thereof overlaps that described above, and is thus omitted.

As set forth above, according to the exemplary embodiments in the present disclosure, a semiconductor package having a structure of a UBM layer in which a process may be simplified and a fine pitch may be implemented may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a semiconductor chip having an active surface having connection pads disposed thereon;
   a connection member disposed on the active surface of the semiconductor chip and including a redistribution layer electrically connected to the connection pads;
   a passivation layer disposed on the connection member; and
   an underbump metallurgy (UBM) layer embedded in the passivation layer and electrically connected to the redistribution layer of the connection member,
   wherein the UBM layer includes
      a UBM pad embedded in the passivation layer,
      at least one plating layer disposed on the UBM pad such that a first surface of the at least one plating layer contacts the UBM pad and at least portions of side surfaces of the at least one plating layer, adjacent to and connecting to the first surface, are covered by the UBM pad, and
      a UBM via penetrating through at least portions of the passivation layer and electrically connecting the redistribution layer of the connection member and the UBM pad to each other.

2. The semiconductor package of claim 1, wherein a lower surface of the plating layer is disposed on the same level as that of a lower surface of the passivation layer, and a lower surface of the UBM pad is disposed on a level above the lower surface of the plating layer.

3. The semiconductor package of claim 1, wherein the UBM layer further includes a barrier layer disposed between the plating layer and the UBM pad.

4. The semiconductor package of claim 3, wherein the barrier layer covers an upper surface and at least portions of the side surfaces of the plating layer.

5. The semiconductor package of claim 1, wherein the plating layer includes a first plating, layer including gold (Au) and a second plating layer disposed between the first plating layer and the UBM pad and including nickel (Ni).

6. The semiconductor package of claim 1, wherein the plating layer includes tin (Sn).

7. The semiconductor package of claim 6, further comprising a copper post disposed on the plating layer.

8. The semiconductor package of claim 1, wherein the UBM layer includes:
   a first UBM layer including the UBM pad, the plating layer, and the UBM via; and
   a second UBM layer consisting of the UBM pad and the UBM via.

9. The semiconductor package of claim 8, further comprising a first connection terminal connected to the first UBM layer and a second connection terminal connected to the second UBM layer,
wherein the first and second connection terminals include different materials.

10. The semiconductor package of claim 9, wherein the plating layer includes tin (Sn), and the first connection terminal is a copper post.

11. The semiconductor package of claim 1, wherein a width of an upper surface of the UBM via in contact with the redistribution layer of the connection member is greater than a width of a lower surface thereof in contact with the UBM pad.

12. The semiconductor package of claim 1, wherein the connection member is an organic interposer.

13. The semiconductor package of claim 1, wherein the semiconductor chip includes a processor chip and a memory chip, and
the processor chip and the memory chip are electrically connected to each other through the connection member.

14. A semiconductor package comprising:
a semiconductor chip having an active surface having connection pads disposed thereon;
a connection member disposed on the active surface of the semiconductor chip and including a redistribution layer electrically connected to the connection pads;
a passivation layer disposed on the connection member;
an underbump metallurgy (UBM) pad embedded in the passivation layer and electrically connected to the redistribution layer of the connection member; and
at least one plating layer disposed on the UBM pad such that a first surface of the at least one plating layer and at least portions of side surfaces of the at least one plating layer, which are adjacent to and connect to the first surface, are covered by the UBM pad.

15. The semiconductor package of claim 14, wherein the connection member includes an insulating layer in contact with the passivation layer, a first redistribution layer embedded in the insulating layer and in contact with the passivation layer, a second redistribution layer disposed on the insulating layer, and a via penetrating through at least portions of the insulating layer and electrically connecting the first redistribution layer and the second redistribution layer to each other, and
a width of an upper surface of the via in contact with the second redistribution layer is greater than a width of a lower surface thereof in contact with the first redistribution layer.

16. The semiconductor package of claim 14, wherein a lower surface of the plating layer is disposed on the same level as a level of a lower surface of the passivation layer, and a lower surface of the UBM pad is disposed on a level above the lower surface of the plating layer.

17. A connection member for a semiconductor package, the connection member comprising:
a redistribution layer configured to electrically connect connection pads of a semiconductor chip with connection terminals;
a passivation layer disposed on the redistribution layer;
underbump metallurgy (UBM) pads embedded in the passivation layer and electrically connected to the redistribution layer; and
a plating layer disposed on each of the UBM pads such that a first surface of the plating layer and at least a portion of side surfaces of the plating layer, which are adjacent to and connect to the first surface, is covered by the corresponding UBM pad,
wherein the connection terminals are disposed on the UBM pads.

18. The connection member of claim 17, further comprising:
UBM vias penetrating through the passivation layer and connecting the UBM pads to the redistribution layer,
wherein a width of a first surface of the UBM via in contact with the redistribution layer is greater than a width of a second surface, thereof in contact with the UBM pad.

19. The connection member of claim 17, wherein the plating layer includes a first plating layer including gold (Au) and a second plating layer disposed between the first plating layer and the UBM pad and including nickel (Ni).

20. The semiconductor package of claim 1, wherein the UBM layer is configured to physically connect to connection terminals,
the passivation layer having the UBM pad embedded therein has a first surface contacting the connection member, and a second surface opposite to the first surface and free of any passivation layer, and
the at least one plating layer is configured to physically connect to the connection terminals.

* * * * *